United States Patent [19]

Crouse

[11] 4,184,113
[45] Jan. 15, 1980

[54] METHOD OF COUNTING ELECTRICAL LOAD CURRENT PULSATIONS

[75] Inventor: George B. Crouse, Waxhaw, N.C.

[73] Assignee: Compu-Trol, Inc., Charlotte, N.C.

[21] Appl. No.: 849,249

[22] Filed: Nov. 7, 1977

[51] Int. Cl.² .................... G01R 19/00; G01R 19/14
[52] U.S. Cl. .............................. 324/102; 235/92 PD; 324/133; 340/659
[58] Field of Search ...................... 324/120, 102, 133; 340/253 P, 253 A, 659, 662, 664; 235/92 PD

[56] References Cited

U.S. PATENT DOCUMENTS

| | | |
|---|---|---|
| 2,724,821 | 11/1955 | Schweitzer, Jr. .................... 324/127 |
| 3,775,675 | 11/1973 | Freeze et al. ........................ 340/253 A |
| 3,846,698 | 11/1974 | Lawton ................................ 324/102 |
| 3,882,378 | 5/1975 | Foord .................................. 324/102 |
| 4,025,850 | 5/1977 | Spiteri ................................ 324/133 |

Primary Examiner—Rudolph V. Rolinec
Assistant Examiner—Ernest F. Karlsen
Attorney, Agent, or Firm—Richards, Shefte & Pinckney

[57] ABSTRACT

A method of counting the number of load current pulsations in an alternating current supply including monitoring the alternations of the supply current and detecting pulsations thereof by detecting suitable falls of the pulsations following the rises thereof, creating upon detecting a pulsation a discrete signal therefor, said signal creation being powered from said pulsation, and counting the discrete signals to determine the number of pulsations.

12 Claims, 4 Drawing Figures

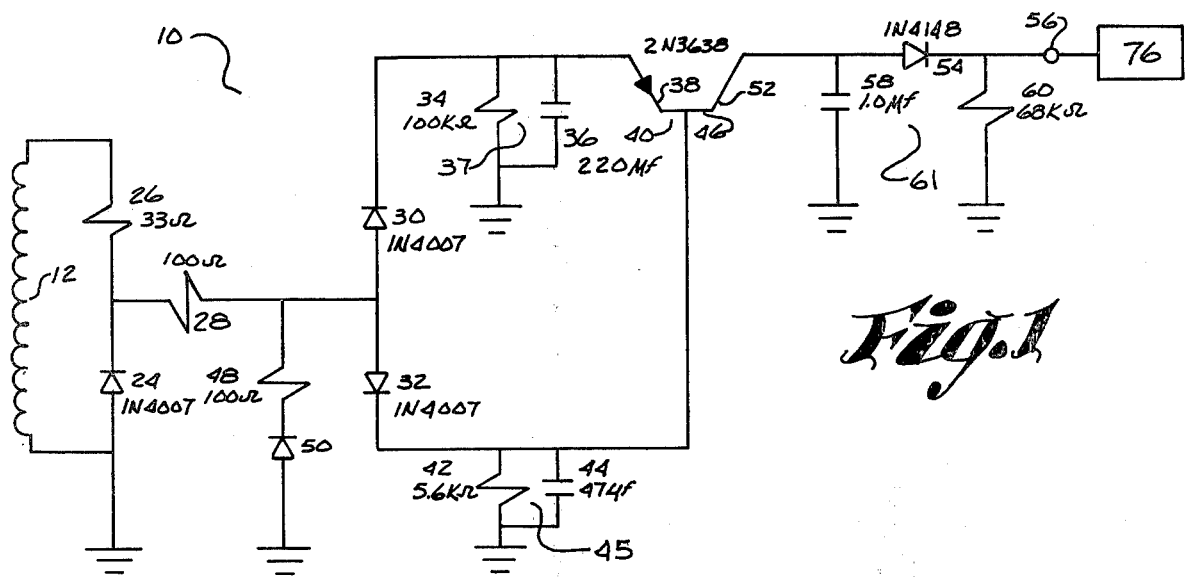
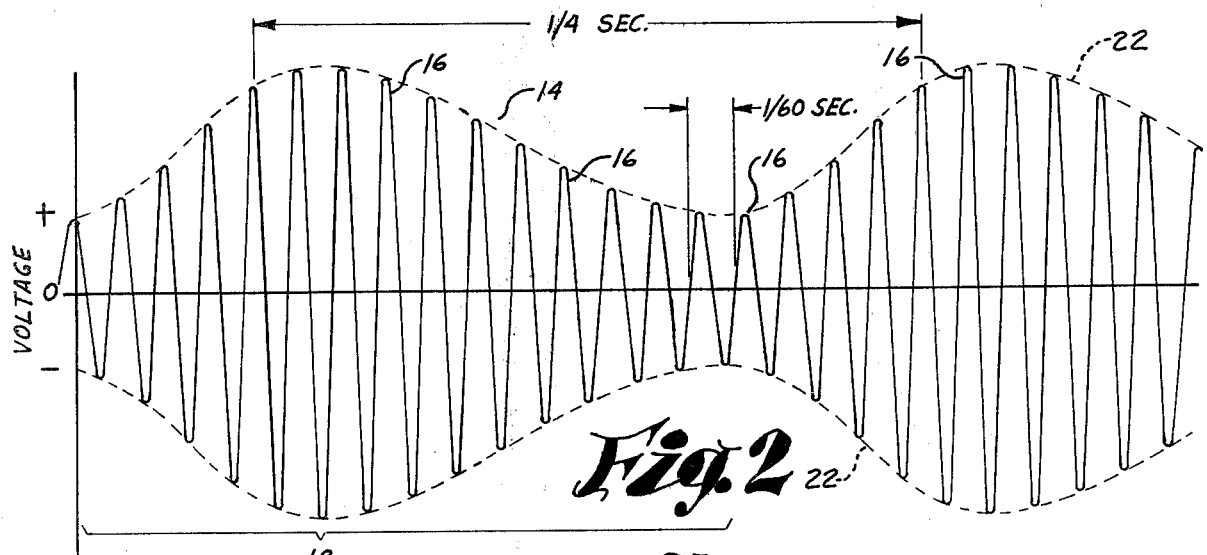
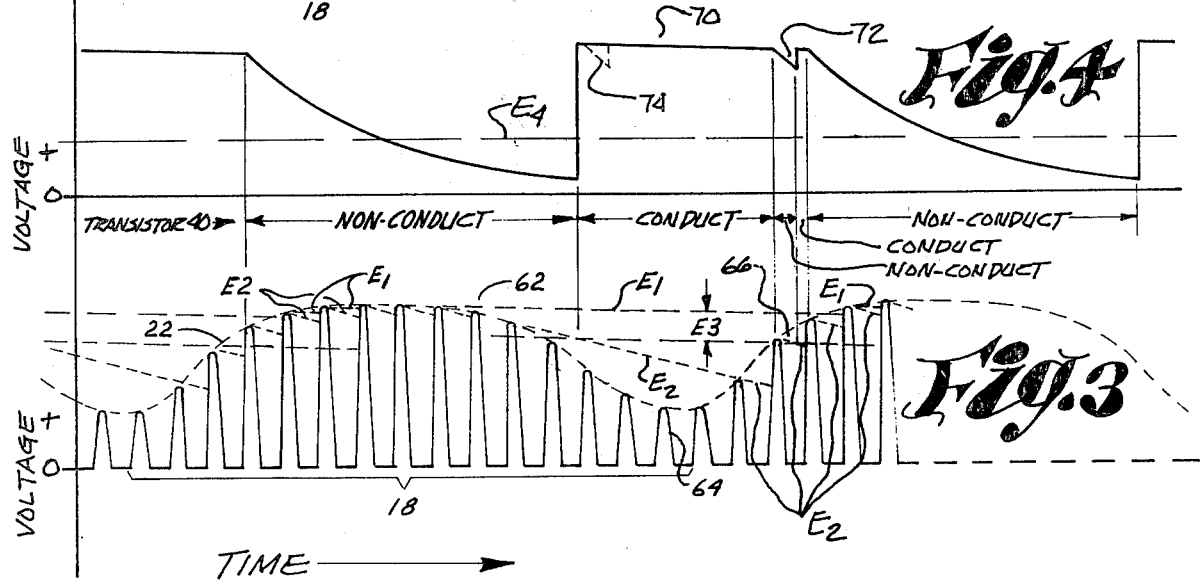

METHOD OF COUNTING ELECTRICAL LOAD CURRENT PULSATIONS

BACKGROUND OF THE INVENTION

Most automatic machinery operates in cyclical fashion, and for production control purposes it is important to be able to determine the number of cycles being performed during an operating period as a measure of work performed and to indicate when work is not being performed so that corrective action may be taken. The present invention provides for such production control by counting load current pulsations in an electrical supply to provide a count of the number of functions performed by the driven device, such as counting the number of picks of a loom during an operating period.

As most electrically powered automatic machinery is driven by alternating current electric motors, operational cycles have been counted heretofore by detecting the presence or absence of power surges in the alternating current supply to a motor while monitoring the alternations of the current supply but without regard to the number of load pulsations during a period of loading. The detection then creates a continuous signal during continuance of the loading, which signal is applied to an integrating calibrated counter or computer which estimates the number of work cycles performed by multiplying the accumulated time during which the signal is received by an assumed cyclic rate of the machinery. Cycle counting has also been performed mechanically by counters connected to machine shafts rotating in proportional relation to work cycles, electromechanically or electrically through switches operated by cams on such shafts or other working parts, or electrically through proximity switches associated with such shafts or parts.

While these prior art counting devices are serviceable, they are less than desirable. For example, the continuous power surge indicators do not actually count cycles, but must be calibrated on the basis of an independent reading of a representative cyclic rate of the machinery, which may differ from machine to machine, and may vary in a given machine according to electrical supply voltages, machine maintenance, workpiece material or other variables. The other aforementioned counters are subject to mechanical maintenance and breakdowns, they clutter up the machinery, they are expensive, some are subject to cheating, and the mechanical ones retain their data at the machine rather than transmit it to a central collection and control point.

The present invention utilizes the aforementioned power surges by taking the detection of pulsations of cyclical loading, as indicated by a continuous signal in the prior art devices, and monitoring these individual pulsations to provide an indication of the individual cycles that are then counted to provide a precise, rather than calibrated, reading of the number of work cycles performed during a particular work period. Thus, the method of the present invention can be used with solid state electronic apparatus hardly subject to breakdown, requiring no maintenance, and self-powered by the current pulsations it monitors. It may be applied to a variety of machines and to multiple installations of similar machines without individual calibration and may be applied internally of existing control apparatus and is inexpensive to install. It is virtually cheatproof and ideally suited to create signals for transmission to a remote central counting, data collection, computer center, or control point. The novel method of the present invention utilizes the pulse detector in a new way in order to create a discrete signal corresponding to each pulsation for use in counting the pulsations, and such a capability has not existed heretofore.

SUMMARY OF THE INVENTION

Briefly described, the method of the present invention is used in an alternating current electrical supply to count the number of load current pulsations therein occurring at a lower frequency than the alternating current frequency. The method includes monitoring alternations of the supply current for detecting the pulsations thereof, creating a discrete signal for each said pulsation in response to said detecting, and counting said discrete signals to determine the number of pulsations.

The detecting of a single pulsation may be subjected to interruption during the detecting thereof, and preferably, creating a discrete signal includes creating at the detecting of a single pulsation an electrical charge at a level in a range suitable for counting, allowing the charge to decay within the range during an interruption of detecting, renewing the charge at the end of the interruption, and allowing the charge to decay below the range upon cessation of the detecting of the single pulsation.

The preferred embodiment of the method of the present invention includes maintaining the decaying charge in the suitable range for counting for a longer period than the period of a supply current alternation, storing the decaying charge in a capacitor, and allowing the decaying charge to decay by dissipation in an electrical resistance. Also, the method includes powering the discrete signal creation from the monitored alternations.

BRIEF DESCRIPTION OF THE DRAWINGS

FIG. 1 is a schematic circuit diagram of the electrical load pulsation detector used in practicing the method of the present invention;

FIG. 2 is a diagrammatic representation of a typical voltage wave form appearing across the transformer secondary of FIG. 1 during electrical load pulsation;

FIG. 3 is a diagrammatic representation of a rectified voltage wave form appearing between the back-to-back rectifiers of FIG. 1 during electrical load pulsation; and FIG. 4 is a diagrammatic representation of a typical discrete signal voltage wave form appearing at the signal terminal of FIG. 1 as a result of a pulsation as shown in FIG. 3.

DESCRIPTION OF THE PREFERRED EMBODIMENT

The preferred embodiment of the method of the present invention is particularly useful for monitoring the production of machines for manufacturing textile fabric or cloth by such processes as weaving on looms or knitting on flat-bed knitting machines, where the filling, weft, or thread insertion is commonly accomplished in cycles. In looms each yarn insertion is commonly referred to as a "pick." The electrical load pulsation detector apparatus here disclosed for practicing the method of the present invention on a loom is a "pick detector" as it monitors the load current alternations, and detects the pulsation thereof at each pick caused by the electrical power load resulting from intermittent cyclic actuation of a picker stick that throws a yarn carrying shuttle across the loom to insert a pick and of a lay beam that beats up the pick. These pulsations are detected in the current flowing through one of the electrical conductors (not shown) supplying alternating current power to the electrical drive motor (not shown) of the loom or other equipment with which the method is used.

As shown in FIG. 1, the pick detector 10 is typically connected in isolated fashion to the power supply to the drive motor by the primary (not shown) of a transformer connected in series relation with one phase wire of the power supply, and the transformer secondary 12 which is grounded at one side thereof. The transformer transmits to the pick detector 10 the voltage wave form 14, as shown in FIG. 2, corresponding to the current supplied to the drive motor. The wave form 14 includes multiple alternations designated by the numerals 16, occurring typically at a frequency of 60 Hertz, and cyclically expanding and contracting to form pulsations 18 of the alternations 16, which pulsations may typically occur at frequencies of one to six Hertz in the aforementioned fabric forming machines. As shown in FIGS. 2 and 3, the proportions are those of alternations 16 at 60 Hertz, and of pulsation 18 at 4 Hertz. The shape of the envelope enclosing the pulsating alternations 16 as indicated by the broken line designated by the numeral 22, may vary with the specific picking loads of various fabric forming machines and even with the particular fabrics being formed, but will typically be generally uniform in a given machine running normally, and of a more or less distorted, somewhat sinusoidal shape corresponding to the actual load placed on the drive motor by the driven machine, and the exact shape is of no particular concern as the pick detector 10 inherently accommodates thereto.

Typically, the peaks of the pulsations 18 of the wave form 14 lie in the range of 5-20 volts from zero, while the troughs between the pulsations 18 lie in the range of 2-10 volts, with the common variety of narrow and wide looms, motor sizes, and other variables.

The pick detector 10 includes a rectifier 24 connected in series with a current limiting resistor 26 across the transformer secondary 12. A voltage dividing resistor 28 is connected at one end thereof to the junction between rectifier 24 and resistor 26, and at the other end thereof is connected commonly to one side of second and third rectifiers 30 and 32 respectively. The other side of rectifier 30 is connected commonly to one side of a first discharging resistor 34 and of a first storage capacitor 36 forming a first storing and discharging means 37, and to the emitter 38 of a transistor 40; while the other ends of resistor 34 and capacitor 36 are connected together and grounded. The other side of rectifier 32 is connected commonly to one side of a second discharging resistor 42 and of a second storage capacitor 44 forming a second storing and discharging means 45 and to the base 46 of the transistor 40, while the other ends of the resistor 42 and the capacitor 44 are connected together and grounded.

A second current limiting resistor 48 is connected at one end thereof to the common junction of resistor 28 and rectifiers 30 and 32, and at the other end thereof to one side of a voltage limiting zener diode 50 which is grounded at its other side.

The collector 52 of the transistor 40 may be protected from stray reverse currents by a fourth rectifier 54 connected in series between the collector 52 and a discrete signal terminal 56. A capacitor 58 and a resistor 60 are connected respectively between ground and the collector 52 to provide a filter 61 between the collector 52 and the terminal 56 for creating a discrete signal for each pulsation 18 in response to its detection by the pick detector 10.

In operation, the positive alternations of the wave form 14 are transmitted through the resistors 26 and 28 and the rectifiers 30 and 32 respectively to the storing and discharging means 37 and 45 respectively. The negative alternations of the wave form 14 are transmitted through the resistor 26 to the rectifier 24 and are grounded by the conduction of the rectifier 24 when biased in that direction, so that a rectified voltage wave form as indicated by the numeral 62 in FIG. 3 appears at the junction of rectifiers 30 and 32 for transmission to the storing and discharging means 37 and 45 respectively.

At any time that the positive voltage transmitted to the rectifiers 30 and 32 respectively exceeds the positive voltage of the respective charges stored in the capacitors 36 and 44, current will flow through the respective rectifier 30 or 32, or both of them, to the respective capacitor 36 or 44, or both of them, whose stored charge voltage is exceeded, thereby creating an electrical charge in each capacitor 36 and 44 whose voltage corresponds to the peak value of a rectified alternation wave form 64 as transmitted to and through the rectifiers 30 and 32. The resistors 26 and 28 in series with the parallel combination of resistors 34 and 42 form a voltage divider for the voltage available across the transformer secondary 12 and determine the specific voltage transmitted to the capacitors 36 and 44.

In normal operation, after the peak of each alternation wave form 64 which exceeds one or both of the charges stored in the respective capacitors 36 and 44, the charge or charges will be discharged at rates determined by the respective R-C constants of the storing and discharging means 37 and 45, leakage of any charge back toward the transformer secondary 12 being prevented by the rectifiers 30 and 32. The voltage of the charges on the respective capacitors 36 and 44 will decay generally as indicated by the broken line curves designated as $E_1$ and $E_2$ respectively in FIG. 3.

The respective R-C constants are chosen so that the divergence of the decaying charge voltage curves $E_1$ and $E_2$ between adjacent 60 Hertz alternation peaks is less than the predetermined voltage difference $E_3$ required to cause the transistor 40 to conduct (0.75 volts in this embodiment), but so that the divergence is at least equal to the predetermined difference $E_3$ when the charges are allowed to decay for a somewhat longer period than that between the peaks of adjacent 60 Hertz alternation wave forms 64. However, other relationships of the initial values of the charges of capacitors 36 and 44 might be used, as well as other relationships of $E_1$ and $E_2$ than the difference $E_3$ might be used for indicating a suitable decay situation, by suitable choice of electrical elements. As shown in FIG. 3, after the rise of a pulsation 18, and during the fall thereof, the charges resulting from the peaks of the alternating wave forms 64 are permitted to decay over an extended period of time without being recharged, and the respective voltages $E_1$ and $E_2$ decay divergently to the point where their difference is equal to the predetermined value indicated as $E_3$. At that point, the transistor 40 becomes conductive, creating a positive voltage at its collector 52 which is transmitted to the terminal 56 indicating detecting of a pulsation 18, and the voltage will continue until the capacitor 44 is subsequently recharged to the point where the charge voltage difference is less than the predetermined value $E_3$ and the transistor 40 becomes non-conductive. The capacitor 58 and the resistor 60 form a filter 61 for creating a discrete signal at the terminal 56 from the voltage or voltages appearing at the collector 52 indicating the detecting of a pulsation, as explained immediately hereinafter. To create a suitable discrete signal, it is necessary to maintain at terminal 56 a voltage at a level in a range suitable for counting (sufficient to actuate a counter or computer or the like connected to the terminal 56) during the portions of pulsations 18 when the transistor 40 might become briefly non-conductive.

The voltage at the collector 52 indicating detecting of a pulsation 18 may be subject to interruption briefly by the peak of an alternation 64 of the succeeding pulsation 18 (as in the area generally indicated by the numeral 66 in FIG. 3) which recharges the capacitor 44 to a voltage level where the predetermined critical voltage difference $E_3$ no longer exists and the transistor 40 becomes non-conductive. However, the voltage on the collector 52 will be resumed within the period of an alternation 64 if the capacitor 44 voltage level $E_2$ decays to where the voltage difference $E_3$ is again reached as in the area indicated by the numeral 66. The next succeeding alternation 64 of the succeeding pulsation 18 will normally charge the capacitor 44 to a level where the voltage difference $E_3$ will not be reached again until after the passage of the peak of the succeeding pulsation 18, causing cessation of the detecting of the first-mentioned pulsation 18.

Such brief interruption of the detecting of a pulsation 18 may occur on both the rising and falling portions of a pulsation 18, and may occur irregularly, since it is unlikely in actual practice that the exact phase relations between pulsations 18 and wave forms 64 as shown in FIGS. 2 and 3 will occur or recur, except at random, due to normal variations in the cyclic rates of both the alternating power supply and the cyclically loaded machinery. Therefore, it is not accurate to count the conduction periods of the transistor 40 as detections of pulsations to get a count of the pulsations 18, but the filter 61 is employed to integrate any interrupted conduction period of transistor 40 for a given pulsation 18 to create a discrete signal for each pulsation 18. FIG. 4 shows a typical voltage waveform 70 for a discrete signal for counting as it appears at the terminal 56 and as further explained hereinafter.

The filter 61 will be charged to a voltage generally corresponding to that of the decaying charge voltage $E_1$ at any time the transistor 40 conducts and will store that charge in the capacitor 58 for decay starting as soon as the transistor 40 becomes non-conductive. In this preferred embodiment, the time constant of the RC filter network formed by capacitor 58 and resistor 60 corresponds to approximately four cycles of the typical alternating current supply (60 Hertz). When the conduction of the transistor 40 (and the voltage conducted to its collector 52) is briefly interrupted at a point in a pulsation 18 as indicated at the numeral 66 in FIG. 3, the voltage charge on the capacitor 58 will be maintained at a level within a range suitable for counting (as explained hereinbefore) as it decays by dissipation in the resistor 60 during the period until the arrival of the peak of the next succeeding alternation wave form 64. If the transistor 40 should conduct again during that period, as is indicated by the charge voltage $E_2$ dropping below the $E_3$ voltage difference as indicated at the numeral 66, the filter 61 will immediately be recharged.

Upon cessation of the detection of the pulsation 18, as indicated by the cessation of conduction of the transistor 40 resulting from that particular pulsation, the voltage charge on the capacitor 58 will decay to a level below the lower limit (which may typically be about 2.5 volts and is indicated by the broken line labeled $E_4$ in FIG. 4) of the voltage range suitable for counting, thereby ending the discrete signal for that particular pulsation. Thus the typical wave form 70 of the discrete signal created for each pulsation may frequently include a notch 72 at the trailing end of the waveform 70 indicating a brief interruption of the conduction of the transistor 40 as indicated at 66. Such a brief interruption of the conduction of the transistor 40 on the falling portion of a pulsation 18 would cause a similar notch as shown in broken lines enumerated 74 on the leading end of the wave form 70, and similarly would not disturb the discrete signal created for that pulsation by the filter 61.

The resistor 48 and the zener diode 50 provide a means of protecting the circuitry by controlling and limiting the voltage applied to the rectifiers 30 and 32, as any positive voltage greater than a predetermined breakdown voltage (15 volts in this embodiment) applied to the zener diode 50 will cause the diode 50 to become conductive while maintaining a 15 volt drop thereacross to ground and draining off any excessive current to ground only as limited by the resistor 48. The voltage applied to the rectifiers 30 and 32 is then limited by the voltage division between resistors 26 and 28 taken as one element and resistor 48 and zener diode 50 taken as another element. The resistor 48 and the zener diode 50 may not be necessary where the voltage appearing across the transformer secondary 12 is otherwise limited suitably by the characteristics of the pulsating load as by a low locked-rotor current characteristic of the drive motor, e.g.

The discrete output signals at terminal 56 may be counted to determine the number of pulsations, as the last step in the method of this invention, by being applied to the counting circuitry of a counter 76, such as a conventional 3 or 4 bit binary up counter, and signal pulses may be counted to 8 or 16 and then be dumped to a computer for further manipulation. From the above description it is apparent that no external power is required for creating the discrete output signals of the present invention except that derived from detecting the pulsations of the supply current and passed on through the transistor 40 to create the discrete signal in the filter 61. The simple solid state circuit of the preferred embodiment of the pick detector 10 may advantageously be installed in the conventional motor starter enclosure of a loom or other equipment with which the present method is used.

It should be noted that the diodes and transistor shown in FIG. 1 are designated by their industry standard type numbers.

While the preferred embodiment explained here in full detail and illustrated in the drawings discloses the best known mode of practicing the method of the present invention, it is obvious that various combinations of specific components could be used to perform the identical service as the preferred embodiment, or to accommodate different circumstances of load pulsation, alternating current voltages and frequencies, signal requirements for a computer, or otherwise; therefore, this embodiment is not intended to limit the scope of the present invention, which is to be determined by the scope of the appended claims.

I claim:

1. In an alternating current electrical supply, a method of counting the number of load current pulsations thereof occurring at a lower frequency than the alternating current frequency comprising:
    (a) monitoring alternations of said supply current for detecting said pulsations thereof;
    (b) creating a discrete signal for each said pulsation in response to said detecting; and
    (c) counting said discrete signals to determine the number of said pulsations;

said method being characterized further in that said detecting of a single one of said pulsations may be subjected to interruption during said detecting of said single pulsation, and in that said creating a discrete signal comprises creating at said detecting of said single pulsation an electrical charge at a level in a range suitable for counting, allowing said charge to decay within said range during an interruption, renewing said charge at the end of said interruption, and allowing said charge to decay below said range upon cessation of said detecting of said single pulsation.

2. A method of counting load current pulsations according to claim 1 and characterized further by maintaining said decaying charge in said range for a longer period than the period of a supply current alternation.

3. A method of counting load current pulsations according to claim 2 and characterized further by storing said decaying charge in a capacitor.

4. A method of counting load current pulsations according to claim 3 and characterized further by allowing said decaying charge to decay by dissipation in an electrical resistance.

5. A method of counting load current pulsations according to claim 1 and characterized further by powering said discrete signal creation from said monitored alternations.

6. A method of counting load current pulsations according to claim 1 and characterized further by using said detected pulsations for powering said discrete signal creation.

7. A method of counting load current pulsations according to claim 1 and characterized further by maintaining said decaying charge in said range for a longer period than the period of a supply current alternation.

8. A method of counting load current pulsations according to claim 7 and characterized further by storing said decaying charge in a capacitor.

9. A method of counting load current pulsations according to claim 8 and characterized further by allowing said decaying charge to decay by dissipation in an electrical resistance.

10. A method of counting load current pulsations according to claim 6 and characterized further by maintaining said decaying charge in said range for a longer period than the period of a supply current alternation.

11. A method of counting load current pulsations according to claim 10 and characterized further by storing said decaying charge in a capacitor.

12. A method of counting load current pulsations according to claim 11 and characterized further by allowing said decaying charge to decay by dissipation in an electrical resistance.

* * * * *